(12) United States Patent
Kizer et al.

(10) Patent No.: US 8,159,887 B2
(45) Date of Patent: Apr. 17, 2012

(54) CLOCK SYNCHRONIZATION IN A MEMORY SYSTEM

(75) Inventors: Jade M. Kizer, Windsor, CO (US); John M. Wilson, Raleigh, NC (US); John Eble, III, Chapel Hill, NC (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 50 days.

(21) Appl. No.: 12/596,535

(22) PCT Filed: Apr. 18, 2008

(86) PCT No.: PCT/US2008/005135
§ 371 (c)(1),
(2), (4) Date: Apr. 15, 2010

(87) PCT Pub. No.: WO2008/130703
PCT Pub. Date: Oct. 30, 2008

(65) Prior Publication Data
US 2010/0188910 A1    Jul. 29, 2010

Related U.S. Application Data

(60) Provisional application No. 60/925,209, filed on Apr. 19, 2007.

(51) Int. Cl.
*G11C 7/00* (2006.01)
(52) U.S. Cl. ............... 365/193; 365/233.1; 365/230.06
(58) Field of Classification Search .............. 365/193, 365/233.1, 230.06
See application file for complete search history.

(56) References Cited

U.S. PATENT DOCUMENTS

| | | | |
|---|---|---|---|
| 4,663,735 A | 5/1987 | Novak et al. | 364/900 |
| 5,485,490 A | 1/1996 | Leung et al. | 375/371 |
| 5,642,386 A | 6/1997 | Rocco, Jr. | 375/355 |
| 5,646,968 A | 7/1997 | Kovacs | 327/158 |
| 5,838,749 A | 11/1998 | Casper | 375/376 |
| 5,844,436 A | 12/1998 | Altmann | 327/156 |
| 5,870,549 A | 2/1999 | Doi et al. | 395/200.36 |
| 5,870,594 A | 2/1999 | Doi et al. | 395/558 |
| 5,910,740 A | 6/1999 | Underwood | 327/149 |

(Continued)

FOREIGN PATENT DOCUMENTS

JP        2001-306176        2/2001

(Continued)

OTHER PUBLICATIONS

International Search Report, PCT/US2008/005135, mailed Jan. 12, 2009.

(Continued)

*Primary Examiner* — Tuan T. Nguyen
(74) *Attorney, Agent, or Firm* — Hamilton, Brook, Smith & Reynolds, P.C.

(57) ABSTRACT

A system and method for synchronizing a strobed memory system 10. During memory read and/or memory write operations the corresponding data strobe is sampled at the data destination 50/55 according to a local clock signal 71/73. Based on the results of the sampling, the data strobe and local clock signal are synchronized. In this manner, the data is synchronized to the local clock signal so that sampling of data at the data destination can be performed according to the local clock signal rather than the data strobe.

46 Claims, 11 Drawing Sheets

U.S. PATENT DOCUMENTS

| | | | |
|---|---|---|---|
| 5,948,083 A | 9/1999 | Gervasi | 710/62 |
| 5,977,821 A | 11/1999 | Shibata | 329/306 |
| 5,990,968 A | 11/1999 | Naka et al. | 348/537 |
| 6,085,345 A | 7/2000 | Taylor | 714/731 |
| 6,100,733 A | 8/2000 | Dortu | 327/149 |
| 6,111,446 A | 8/2000 | Keeth | 327/258 |
| 6,114,879 A | 9/2000 | Popplewell et al. | 327/3 |
| 6,125,157 A | 9/2000 | Donnelly | 375/371 |
| 6,166,572 A | 12/2000 | Yamaoka | 327/149 |
| 6,172,937 B1 | 1/2001 | Ilkbahar et al. | 365/233 |
| 6,178,212 B1 | 1/2001 | Akashi | 375/355 |
| 6,201,423 B1 | 3/2001 | Taguchi et al. | 327/141 |
| 6,396,888 B1 | 5/2002 | Notani et al. | 375/364 |
| 6,444,644 B1 | 9/2002 | Bruckdorfer et al. | 514/12 |
| 6,470,405 B2 | 10/2002 | Hampel | 710/100 |
| 6,542,976 B2 | 4/2003 | Hampel | 711/167 |
| 6,570,944 B2 | 5/2003 | Best | 375/355 |
| 6,591,353 B1 | 7/2003 | Ware | 711/167 |
| 6,775,345 B1 | 8/2004 | Song | 375/376 |
| 6,836,503 B2 | 12/2004 | Best | 375/35 |
| 7,016,259 B2 * | 3/2006 | Jakobs | 365/191 |
| 7,349,269 B2 | 3/2008 | Schaefer | 365/193 |
| 7,349,510 B2 | 3/2008 | Best | 375/355 |
| 7,379,382 B2 * | 5/2008 | LaBerge | 365/233.19 |
| 7,668,679 B2 * | 2/2010 | Best | 365/193 |
| 7,969,815 B2 * | 6/2011 | LaBerge | 365/233.1 |
| 2001/0047450 A1 | 11/2001 | Gillingham et al. | 711/105 |
| 2006/0114742 A1 | 6/2006 | Salmon et al. | |
| 2006/0262613 A1 | 11/2006 | Braun et al. | |
| 2010/0118627 A1 * | 5/2010 | Best | 365/193 |

FOREIGN PATENT DOCUMENTS

| | | |
|---|---|---|
| WO | 98/37656 | 8/1998 |

OTHER PUBLICATIONS

Report of Patentability, PCT/US2008/005135, mailed Jul. 31, 2009.

Nakase, Yasunobu, et al., "Source-Synchronization and Timing Vernier Techniques for 1.2 GB/s SLDRAM Interface," IEEE Journal of Solid-State Circuits, vol. 34, No. 4, Apr. 1999, pp. 494-501.

Paris et al., "WP 24.3: a 800 MB/s 72 Mb SLDRAM with Digitally-Calibrated DLL," ISSCC, 0-780-35129-0/99, 10 pages. Slide Supplement, IEEE, 1999.

Gillingham, Peter and Vogley, Bill, "SLDRAM: High Performance Open-Standard Memory," IEEE Micro, Nov./Dec. 1997, p. 29-39, vol. 17, No. 6, Institute of Electrical and Electronics Engineers, Inc., Los Alamitos, California.

Jedec, "Double Data Rate (DDR) SDRAM Specification", JEDEC Standard JESD79, Jun. 2000, JEDEC Solid State Technology Association. 76 pages.

S.Takase and N. Kushiyama, 1999 ISSCC Slide Supplement article entitled "Outline," copyright IEEE, pp. 348-349 and 506-507, 1999.

CAHNERS EDN ACCESS article entitled, "DDR-SDRAM, High-Speed, Source Synchronous Interfaces Create Design Challenges," Sep. 2, 1999, printed Feb. 11, 2001.

Muljono, et al., Intel Corporation article entitled "High Speed, High Bandwidth External Cache Bus with a Center-Tapped-Termination Scheme", pp. 1-7, presented at a Symposium on High Performance Interconnects at Stanford University, Aug. 16-18, 2000. 7 pages.

Ryan, Kevin, "DDR SDRAM Functionality and Controller Read Data Capture," Micron Technology, Inc. Design Line, 1999, pp. 1-24, vol. 8, Issue 3. (24 pages).

MicroNews article entitled "A 1.6-GBps 1Gb Double Data Rate Synchronous DRAM", Third Quarter 1999, vol. 5, No. 3, printed Feb. 24, 2001.

IEEE article entitled "SP 22.5: A 833Mb/s 2.5V 4Mb Double Data Rate SRAM" by H-C. Park et al., pp. 22.5-1 to 22.5-9, copyright 1998.

Kizer, Jade, U.S. Appl. No. 12/628,547 filed Dec. 10, 2009 re Preliminary amendment dated Feb. 12, 2010. 7 Pages.

EP Extended Search Report with mail date of Jun. 29, 2010 re EP Application No. 10156597.6. 7 Pages.

Best, S., et al., U.S. Appl. No. 12/628,547 filed Dec. 10, 2009 re Preliminary Amendment submitted Feb. 12, 2010. 7 pages.

Best, S., et al., U.S. Appl. No. 12/628,547 filed Dec. 10, 2009 re Office Action mailed Jul. 19, 2010. 4 pages.

Information Disclosure Statement, dated Aug. 17, 2010, In U.S. Appl. No. 12/628,547, 2 pages.

EP Communication pursuant to Rule 69 TPC—reminder concerning payment of the designation fee and of the examination fee—and invitation pursuant to Rule 70a(1) EPC, dated Aug. 2, 2010, in EP Application No. 10156597.6-2415. 2 pages.

Information Disclosure Statement by Applicatn, dated Aug. 17, 2010, re U.S. Appl. No. 12/628,547. 2 pages.

Best, S., et al., U.S. Appl. No. 12/628,547 filed Dec. 10, 2009 re Response dated Jan. 12, 2011 to the Office Action mailed Oct. 27, includes Terminal Disclaimer. 4 Pages.

Best, S., et al., U.S. Appl. No. 12/628,547 filed Dec. 10, 2009 re Office Action mailed Oct. 27, 2010, includes Notice of References Cited and Information Disclosure Statement. 19 pages.

EP Response dated Jan. 26, 2011 to the Official communication dated Aug. 2, 2010 for EP Application No. 10156597.6 re Request for Examination. 24 Pages.

EP Office Action dated Feb. 7, 2011 re EP Application No. 10183217.8 includes Documents 1, 2, & 3. 89 Pages.

Best, S., et al., U.S. Appl. No. 12/628,547 filed Dec. 10, 2009 re Notice of Allowance and Fee(s) Due mailed Mar. 25, 2011, includes Information Disclosure Statement. 7 Pages.

* cited by examiner

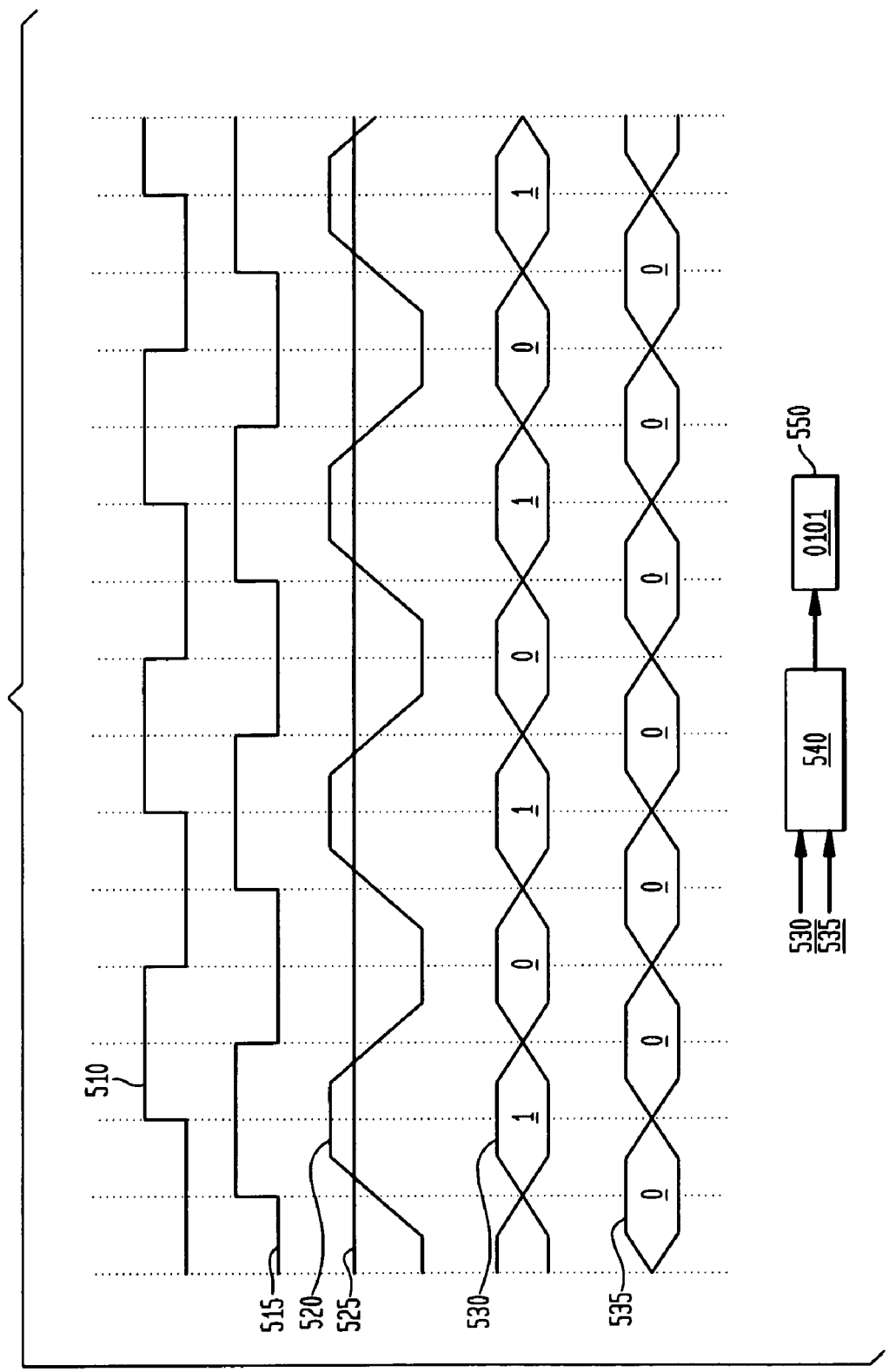

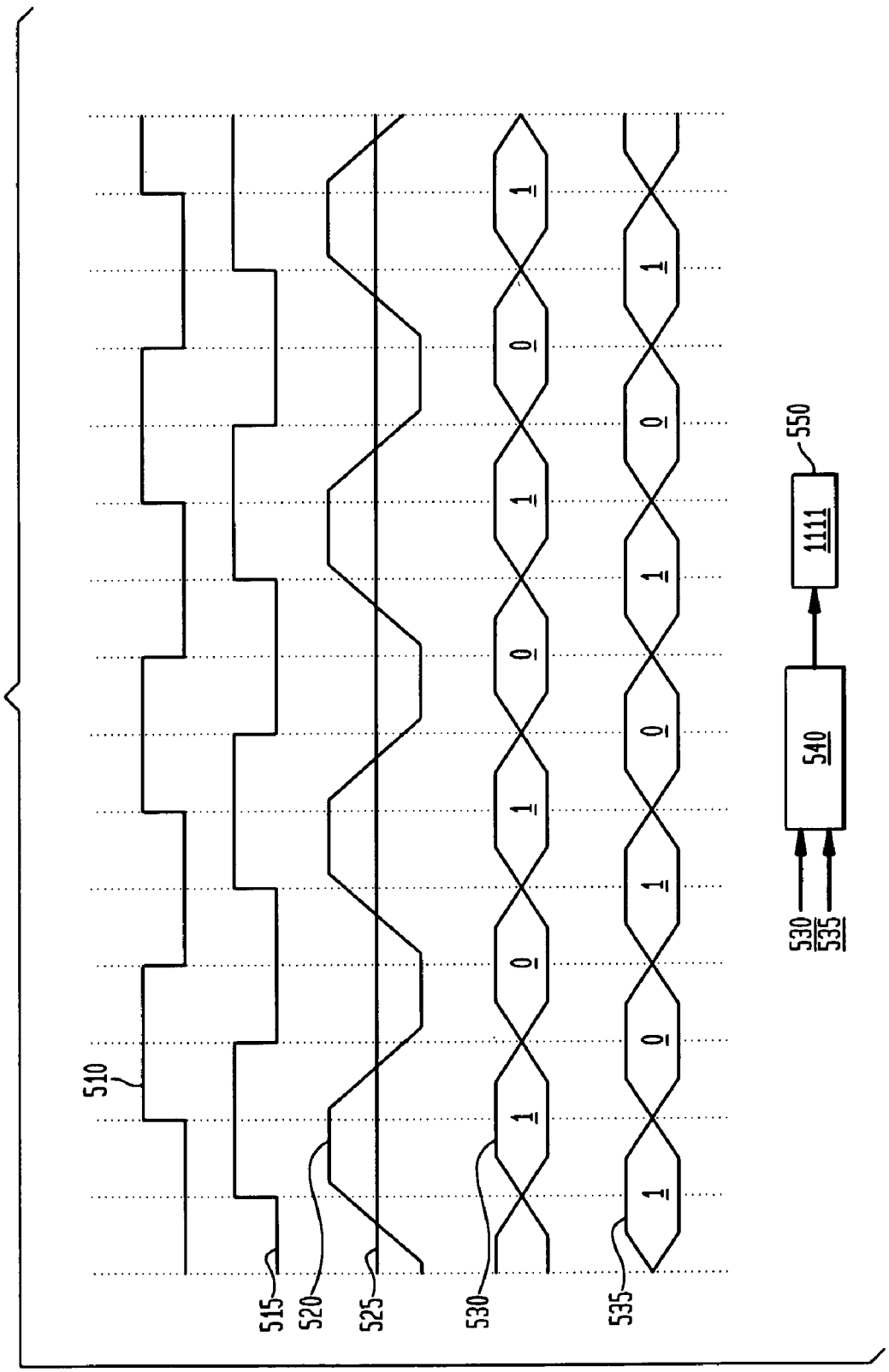

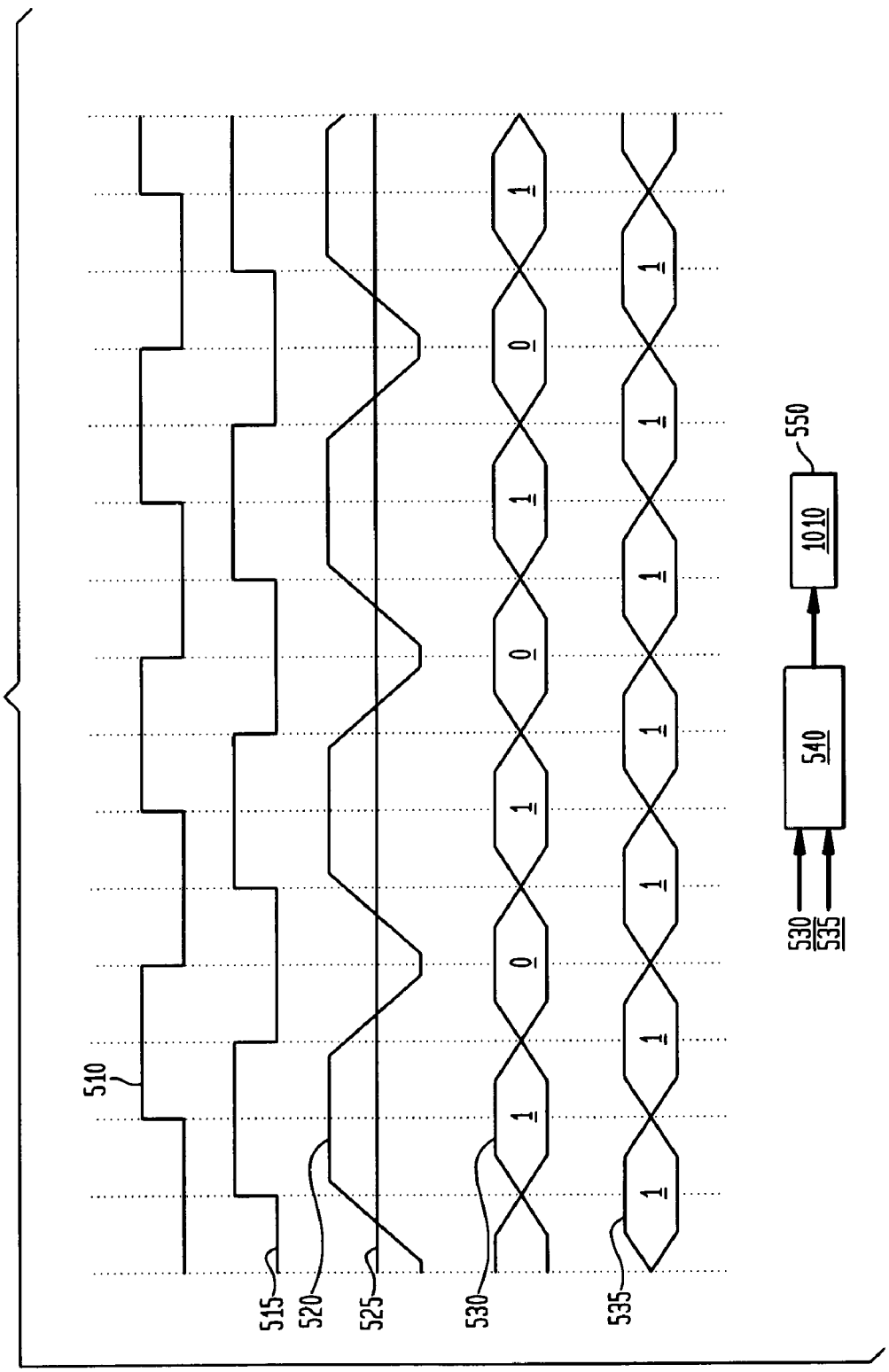

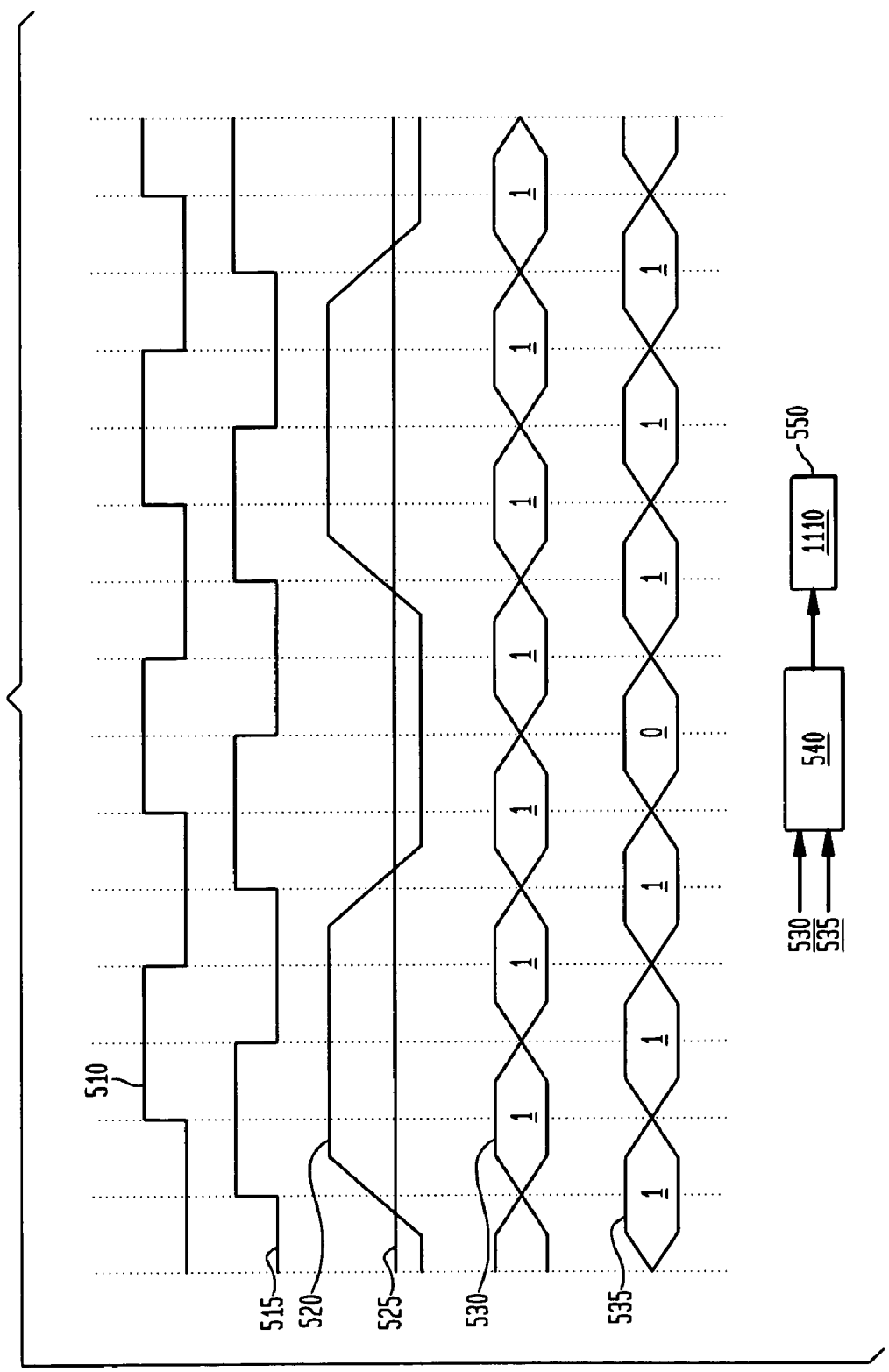

US 8,159,887 B2

CLOCK SYNCHRONIZATION IN A MEMORY SYSTEM

CROSS-REFERENCE TO RELATED APPLICATIONS

The present application is a national stage application under 35 U.S.C. §371 of International Application No. PCT/US2008/005135 filed Apr. 18, 2008, which claims priority from U.S. Provisional Patent Application No. 60/925,209, filed Apr. 19, 2007, the disclosures of which are hereby incorporated herein by reference.

BACKGROUND

Modern memory systems typically include one or more memory devices that are accessed through a memory controller. In a strobe based memory system, data are transferred between the memory device(s) and the memory controller together with timing (or strobe) signals. When data is written from the memory controller to the memory device, the controller transmits write data and write strobe signals to the memory device. The memory device samples the write data signals and the sampling is clocked according to the write strobe signals. When data is read from memory device, the memory device transmits to the controller read data and read strobe signals. The controller samples the read data signals and the sampling is clocked according to the read strobe signals. The timing relationship between data and strobe signals is critical.

Some higher-performance memory devices operate based on a clocked timing architecture. Write data signals are not sampled according to the timing of write strobe signals but to a clock signal at the memory. Also, read data signals are not sampled according to the timing of read strobe signals but to a clock signal at the controller. With such memory devices and memory controller, there is no need to equalize the electrical lengths of timing and data paths to avoid skew between strobe and data signals. Therefore, the complexity of laying out the memory controller, the memory device and the circuit board can be significantly reduced. The clocked timing architecture, however, require the clock for sampling data signals at the memory or the controller to maintain a fixed phase offset relative to the data signals. Such requirement may be difficult to satisfy when environmental drift components are present in the memory system to cause continual phase drift in its clock signals.

BRIEF DESCRIPTIONS OF THE DRAWINGS

The following detailed description given by way of example, but not intended to limit the invention solely to the specific embodiments described, may best be understood in conjunction with the accompanying drawings wherein like reference numerals denote like elements and parts, in which:

FIGS. 5A-5E are timing diagrams useful for illustrating how errors in a timing reference signal are detected according to an embodiment.

DETAILED DESCRIPTION

A memory system comprises a memory controller and a memory device. During a memory write operation, the memory controller transmits to the memory device a write data signal and a first timing reference signal, and the memory device receives the write data signal and first timing reference signal, samples the received write data signal and first timing reference signal. Results derived from sampling the first timing reference signal are stored in the memory device and transmitted to the memory controller after the memory write operation. The memory controller receives and analyzes the results of sampling the first timing reference signal, determines whether there is a need to adjust one or more memory controller clocks, and adjusts at least one memory controller clock in response to having determined that such adjustment is needed.

During a memory read operation, the memory device transmits a read data signal and a second timing reference signal. The memory controller receives the read data signal and the second timing reference signal, samples the received read data signal and samples the second timing reference signal. Based on results derived from sampling the second timing reference signal, the memory controller adjusts one or more memory controller clocks used to sample the read data signal.

In one embodiment, the first timing reference signal includes a write strobe signal and the second timing reference signal includes a read strobe signal. In another embodiment, the first timing reference signal includes a signal having a predetermined pattern, and the second timing reference signal includes a signal having a predetermined pattern.

Figure 1:
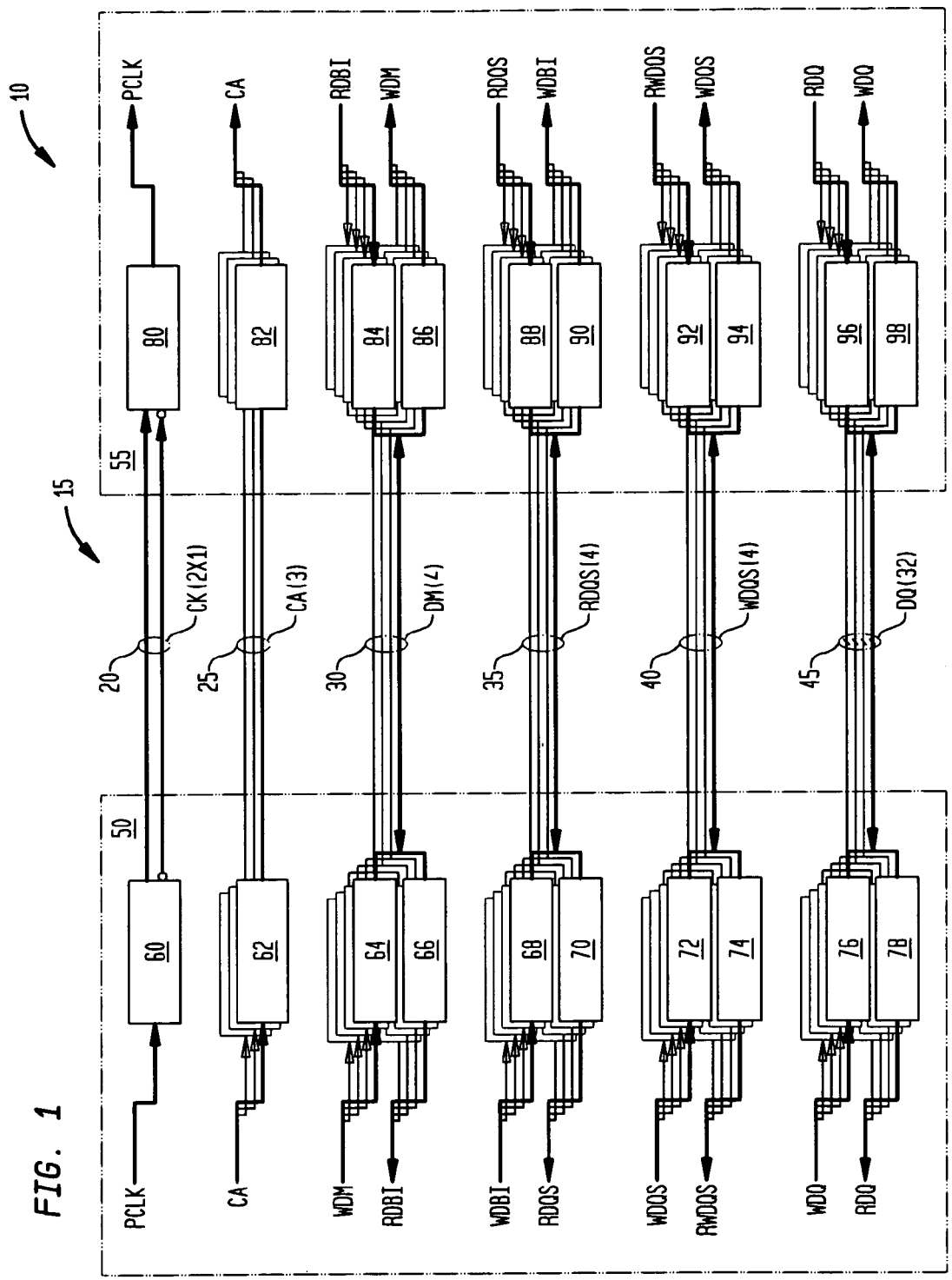
FIG. 1 is a schematic diagram illustrating a memory system according to an embodiment.

FIG. 1 is a block diagram of an embodiment of a memory system 10, such as a graphic double data rate (GDDR) memory system. System 10 includes a memory controller 50, a memory device (such as a DRAM) 55, and a communication channel 15, which may include, for example, a plurality of signal lines for conveying signals between the controller and the memory device. In the example shown in FIG. 1, signals conveyed between the controller 50 and memory device 55 may include one or more clock signals ("PCLK"), one or more control-address signals ("CA"), one or more write data mask signals ("WDM"), one or more read data bus inversion signals ("RDBI"), one or more write data bus inversion signals ("WDBI"), one or more read timing reference signals ("RDQS"), one or more write timing reference signals ("WDQS"), one or more write data signals ("WDQ"), and one or more read data signals ("RDQ"), and one or more write calibration signals RWDQS?

In one embodiment, the communication channel 15 includes a plurality signal lines. Some of the signals conveyed between the controller and memory device are conveyed via dedicated signal lines while others are conveyed via shared signal lines. The PCLK signal is transmitted from a transmit circuit 60 in the controller to a receive circuit 80 in the memory device via a differential signaling line 20 denoted as "CK".

The one or more CA signals are transmitted from the controller to the memory device via a CA link that may be "m" bits wide so that m bits of CA information can be transmitted in parallel from respective transmit circuits 62 in the controller to respective receive circuits 82 in the memory device via respective signal lines 25 (denoted as "CA"). Although, for ease of illustration, only three sets of transmit circuits 62, signal lines 25, and receive circuits 82 are shown in FIG. 1, there may be more or fewer sets of transmit circuits 62, signal lines 25, and receive circuits 82. In one example, 13 CA signals are transmitted in parallel via 13 lines.

The one or more WDM signals are transmitted from the controller to the memory device via a WDM link. In one example, the WDM link is 4 bits wide so that 4 bits of WDM information can be transmitted in parallel from respective transmit circuits 64 in the controller to respective receive circuits 86 in the memory device via respective signal lines (denoted as "DM"). Such four bits of WDM information may correspond to thirty two bits (4 bytes) of write data (WDQ) conveyed in parallel with each other and with the 4 WDM bits, each bit of WDM corresponding to one byte (8 bits) of WDQ in the 4 bytes of WDQ. The WDM may be transmitted as a "double-data-rate" signal. In a double data rate signal, two successive bits of the signal are transmitted on each signal line in one respective clock cycle, one of the two bits being transmitted in response to a first edge (e.g., a rising edge) of a clock signal, and the other of the two bits being transmitted in response to a second edge (e.g., a falling edge) of the clock signal, the first edge immediately preceding the second edge. Thus, 8 bits of WDM may be transmitted in one clock cycle.

The DM lines used to transmit the WDM signal may also be used to convey the one or more RDBI signals. The one or more RDBI signals are transmitted from the memory device to the controller via a RDBI link formed using, for example, the DM lines that may be, for example, 4 bits wide. So, 4 bits of RDBI information can be transmitted in parallel from respective transmit circuits 84 in the memory device to respective receive circuits 66 in the controller via the DM lines 30. Such four bits of RDBI information may correspond to thirty-two bits of read data (RDQ) conveyed in parallel with each other and with the 4 RDBI bits, with each bit of RDBI corresponding to one byte in the 32 bits of RDQ. Like the WDM signal, the RDBI signal may be transmitted as a double-data-rate signal.

The one or more WDBI signals are transmitted from the controller to the memory device via a WDBI link that may be, for example, 4 bits wide. So, 4 bits of WDBI information can be transmitted in parallel from respective transmit circuits 68 in the controller to respective receive circuits in the memory device via respective signal lines 35 (denoted as "RDQS"). Such four bits of WDBI information may correspond to thirty two bits of write data (WDQ) conveyed in parallel with each other and with the 4 WDBI bits, with each bit of WDBI corresponding to one byte of the 32 bits of WDQ. The WDBI signal may be transmitted as a double-data-rate signal.

The RDQS lines 35 are bidirectional signal lines and may also be used to transmit the RDQS signal(s) from the memory device 55 to the controller 50. In one embodiment, the one or more RDQS signals are transmitted via the RDQS lines that may be, for example, 4 bits wide. So, 4 bits of RDQS information can be transmitted in parallel from respective transmit circuits 88 in the memory device to respective receive circuits 70 in the controller via respective RDQS lines 35. Such four bits of RDQS information may correspond to thirty two bits of read data (RDQ) also conveyed in parallel with each other and with the 4 RDQS bits, with each bit of RDQS corresponding to one byte of the 32 bits of RDQ. Like the WDBI signal, the RDQS signal may also be transmitted as a "double-data-rate" signal via the RDQS lines.

The one or more WDQS signals are transmitted from the controller to the memory device via a WDQS link that may be, for example, 4 bits wide. So, 4 bits of WDQS information can be transmitted in parallel from respective transmit circuits 72 in the controller to respective receive circuits in the memory device via signal lines 40 (denoted as "WDQS"). Such four bits of WDQS information may correspond to thirty two bits of write data, signal (WDQ) conveyed in parallel with each other and with the 4 WDQS bits, with each bit of WDQS corresponding to one byte of the 32 bits of WDQ. Like RDQS, the WDQS signal(s) can be double data rate signals.

The WDQ signals are transmitted from the controller to the memory device. In one embodiment, the WDQ signals are transmitted via a WDQ link that may be, for example, 32 bits (4 bytes) wide. So, 32 bits of WDQ information may be transmitted in parallel via respective signal lines 45 (denoted as "DQ"). The controller 50 may include one or more transmit circuits 76 to transmit each byte of WDQ information to corresponding receive circuit(s) in the memory device 55. WDQ may be transmitted as double-data-rate signals.

The 32 DQ lines used to transmit the WDQ signals are bidirectional signal lines and are also used to convey the RDQ signals, which are transmitted from the memory device to the controller. In one embodiment, the RDQ signals are transmitted via a RDQ link that may be, for example, 32 bits (4 bytes) wide, so that 32 bits of WDQ information may be transmitted in parallel via respective lines 45. The memory 55 may include one or more transmit circuits 96 to transmit each byte of RDQ information to corresponding receive circuits 78 in the memory controller 50. Like the WDQ signal, the RDQ signal is transmitted as a double-data-rate signal.

In one embodiment, one or more coefficients or parameters associated with the transmit and/or receive circuits in controller 50 are adjusted or calibrated using the write timing reference signal(s) (WDQS) and/or the read timing reference signal(s) (RDQS). Examples of the coefficients or parameters include the phase(s) of one or more controller clocks for timing the transmission of the WDQ signals and/or receiving the RDQ signals, and equalization and/or crosstalk cancellation coefficients. The controller clocks may be derived from PCLK. The adjustment can be done periodically or continuously to track environmental drifts of the clocks. The WDQS and RDQS signals can also be used to adjust or calibrate other parameters or coefficients associated with the transmit or receive circuits in the memory controller 50 and/or the memory device 55, as illustrated in examples discussed below.

The FIG. 1 embodiment also provides for the generation and transmission of one or more write calibration signals ("RWDQS"). In one example, information for the one or more RWDQS signals may be obtained at the memory device during a write operation and transmitted to the controller 50 after the write operation during, for example, a read operation. In one embodiment, the RWDQS signals are transmitted over a four bit wide signal link so that four RWDQS signals can be transmitted in parallel by respective transmit circuits 92 in the memory device to respective receive circuits 74 in the controller via, for example, the WDQS lines 40. An RWDQS signal may correspond to one or more transmit circuits 76 in the controller 50, to one or more receive circuits 78 in the controller 50, to one or more transmit circuits 96 in the memory 55, and/or to one or more receive circuit 98 in the memory 55. A RWDQS signal may be analyzed or processed by one or more logic or processing circuits (not shown in FIG. 1), with the result of such analysis used to adjust one or more parameters or coefficients in one or more corresponding transmit or receive circuits in the controller 50 and/or in the memory 55, as discussed in the following examples. The RWDQS signal can be transmitted as a double-data-rate signal.

Figure 2:
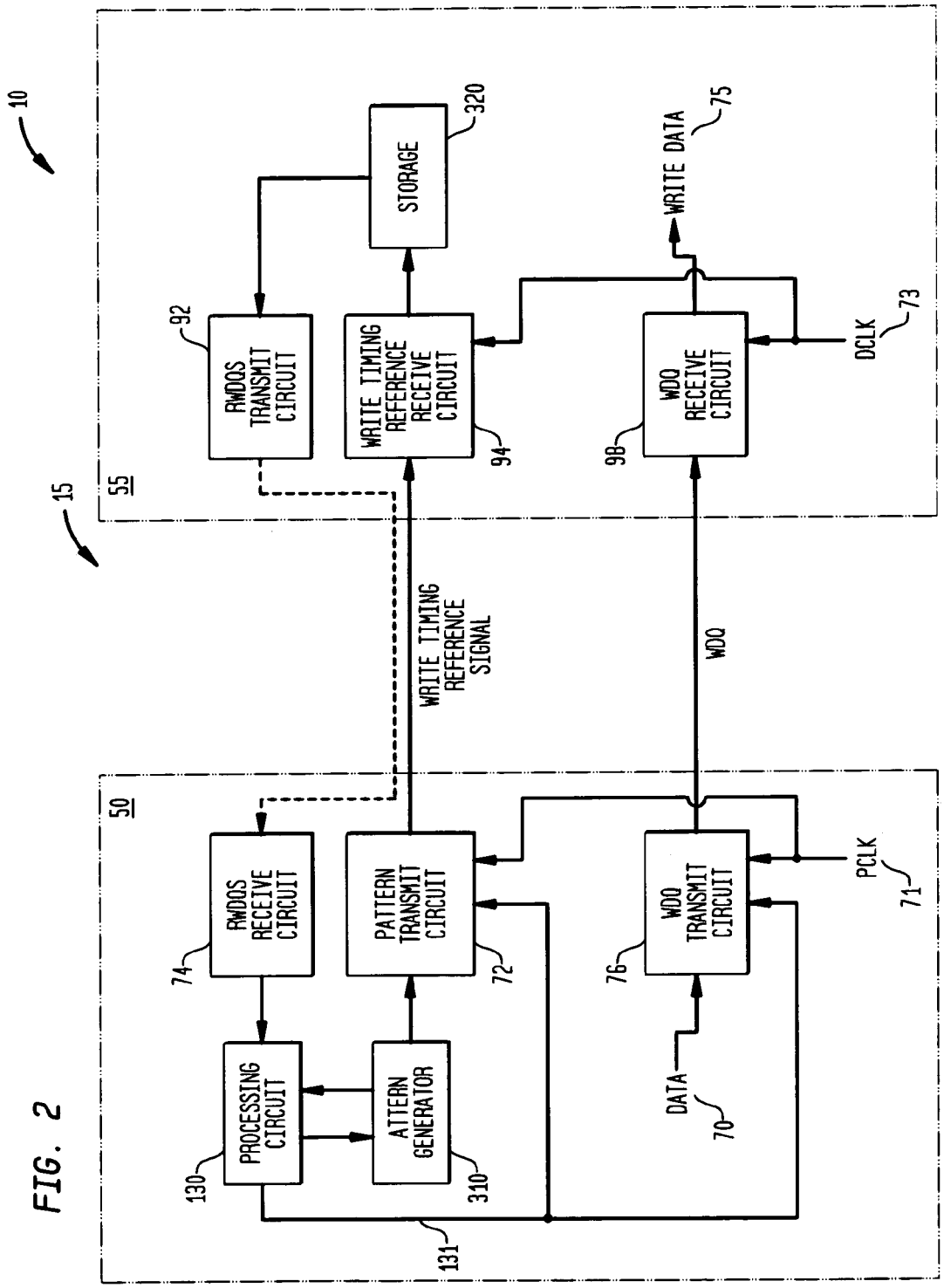
FIG. 2 is a block diagram illustrating a write operation in the memory system in accordance with an embodiment.

FIG. 2 illustrates one example of using a RWDQS signal to calibrate one or more coefficients or parameters in a write data (WDQ) transmit circuit 76. During a write operation, in which data is written from the memory controller 50 to the memory device 55, data 70 is accessed by the controller and passed to a data transmit circuit 76. The data transmit circuit 76 receives a controller clock (e.g., PCLK 71) and may include one or more clock adjustment circuits to generate at least one write data transmit clock by adjusting the phase and/or duty cycle of the PCLK 71. The output of the data transmit circuit 76 includes one or more write data signals (WDQ). Multiple clock adjustment circuits may be included in the WDQ transmit circuit 76 to generate multiple transmit clocks to control the timing of multiple WDQ signals output from the WDQ transmit circuit 76. The multiple transmit clocks may have fixed phase offsets from each other to account for different amount of skews the multiple WDQ signals may experience traveling across the channel 15. The transmit circuit 76 further includes one or more signal transmitters clocked by a same write data transmit clock or by respective ones of the multiple write data transmit clocks, resulting in the WDQ signal(s) at the output of the transmit circuit 76 being substantially synchronized to the same write data transmit clock or to the respective write data transmit clock(s).

A pattern generator 310 generates a pattern to be used for timing reference. The pattern is clocked out of the pattern transmit circuit 72 according to a pattern transmit clock to generate a write timing reference signal (WDQS). The pattern transmit circuit 72 may include a clock adjusting circuit to generate the pattern transmit clock by adjusting the phase and/or duty cycle of the PCLK 71. In an embodiment, the pattern generator 310 is a strobe generator so that the write timing reference signal is a write data strobe signal.

In one embodiment, the clock adjusting circuits in the data transmit circuit 76 and in the pattern transmit circuit 72 are configured such that each write data transmit clock and the pattern transmit clock have a predetermined phase relationship (e.g., about 90°) with each other. Therefore, each WDQ signal and the WDQS signal also have a predetermined phase relationship with each other.

The write data and write timing reference signals transmitted by the controller are respectively received at the memory device by a WDQ receive circuit 98 and a write timing reference receive circuit 94. At the WDQ receive circuit, the write data signal(s) is sampled according to a memory device clock (DCLK) 73, which may be generated based on the PCLK received from the memory controller. The samples generated by the WDQ receive circuit are to be stored in the storage cells of the memory device as write data 75. In order to insure that the write data signal is correctly sampled by DCLK, the write data signal should be timed properly with respect to DCLK, i.e., the write data signal and DCLK should have a proper phase relationship. In the system 10, the timing of the WDQ signal is adjusted according to information derived from the write timing reference signal WDQS.

In one embodiment, as illustrated in FIG. 2, system 10 achieves proper timing of the WDQ signal by sampling the write timing reference signal received at the memory device, analyzing the results of such sampling, and adjusting the timing of the WDQ signal and the write timing reference signal in view of the analysis. More particularly, the write timing reference signal is sampled according to DCLK and/or its derivatives at the timing reference receive circuit 94. The circuit 94 may include clock adjusting circuit(s) to obtain derivatives of the DCLK (e.g., phase adjusted DCLK) and may sample the signal according to, for example, an in-phase DCLK signal ("data clock signal") and/or a quadrature or 90-degree-delayed DCLK signal ("edge clock signal") to produce respective sets of timing reference signal samples, I-samples and/or Q-samples. The results derived from sampling the reference signal, e.g., the I-samples and/or Q-samples and/or representations thereof, are stored in a storage element 320 in the memory device 55. The storage element 320 can be a dedicated storage element, such as a data cache in an interface of the memory device 55, or part of a set of storage cells in a core of the memory device 55. The samples or results derived therefrom are transmitted from the memory device to the controller for analysis during, for example, a read operation, in which data is transmitted from the memory device to the controller.

In one embodiment, the samples of the write timing reference signal or information derived therefrom are transmitted from the memory device to the controller in the form of a write calibration signal (RWDQS), which may be transmitted to the controller via the same lines by which the write timing reference signal (WDQS) is transmitted to the memory device. In other embodiments this write calibration signal could be returned on the lines that had been used for the write data signal. In yet other embodiments a sideband signal that does not carry the write timing reference signal or the write data signal could be used to return the write calibration signal RWDQS.

The write calibration signal RWDQS is received by a RWDQS receive circuit 74 of controller 50. In one embodiment, the RWDQS signal includes information about I-samples and Q-samples stored in the storage 320. The RWDQS receive circuit 74 passes the received RWDQS signal to a processing circuit 130 which obtains the I-samples and Q-samples using a proper decoder if necessary, and considers the samples in pairs, each pair including an I-sample and its corresponding Q-sample.

For example, the processing circuit may perform an exclusive-or operation on each pair of I/Q samples to generate a digital sequence (a sequence made up of logical "1s" and/or "0s") associated with the samples. The processing circuit then searches for the occurrence of one or more predetermined patterns within the digital sequence. Each predetermined pattern is associated with one or more possible error characteristics, as discussed below in examples with reference to FIGS. 5A-5E. When a timing reference signal is determined to exhibit a particular error characteristic, the processing circuit 130 generates a correction signal 131 to the pattern transmit circuit 72 and the data transmit circuit 76 to correct or minimize the error.

In alternate embodiment, only in-phase samples are used to track the timing reference signal. That is, since the edges of WDQS may be aligned with the centers of the write data, the in-phase WDQS samples could provide enough information to track the timing reference signal movement relative to DCLK. This has the advantage that the memory 55 does not have to produce a 90-degree-shifted DCLK and does not have to include two sets of receivers in the WDQS receive circuit 94.

In yet another alternate embodiment, only quadrature samples are used to track the timing reference signal. That is, if the edges of WDQS were aligned with the edges of the write data signal WDQ, samples generated according to a 90-degree-shifted DCLK could provide enough information to track the timing reference signal movement relative to DCLK.

Figure 3:
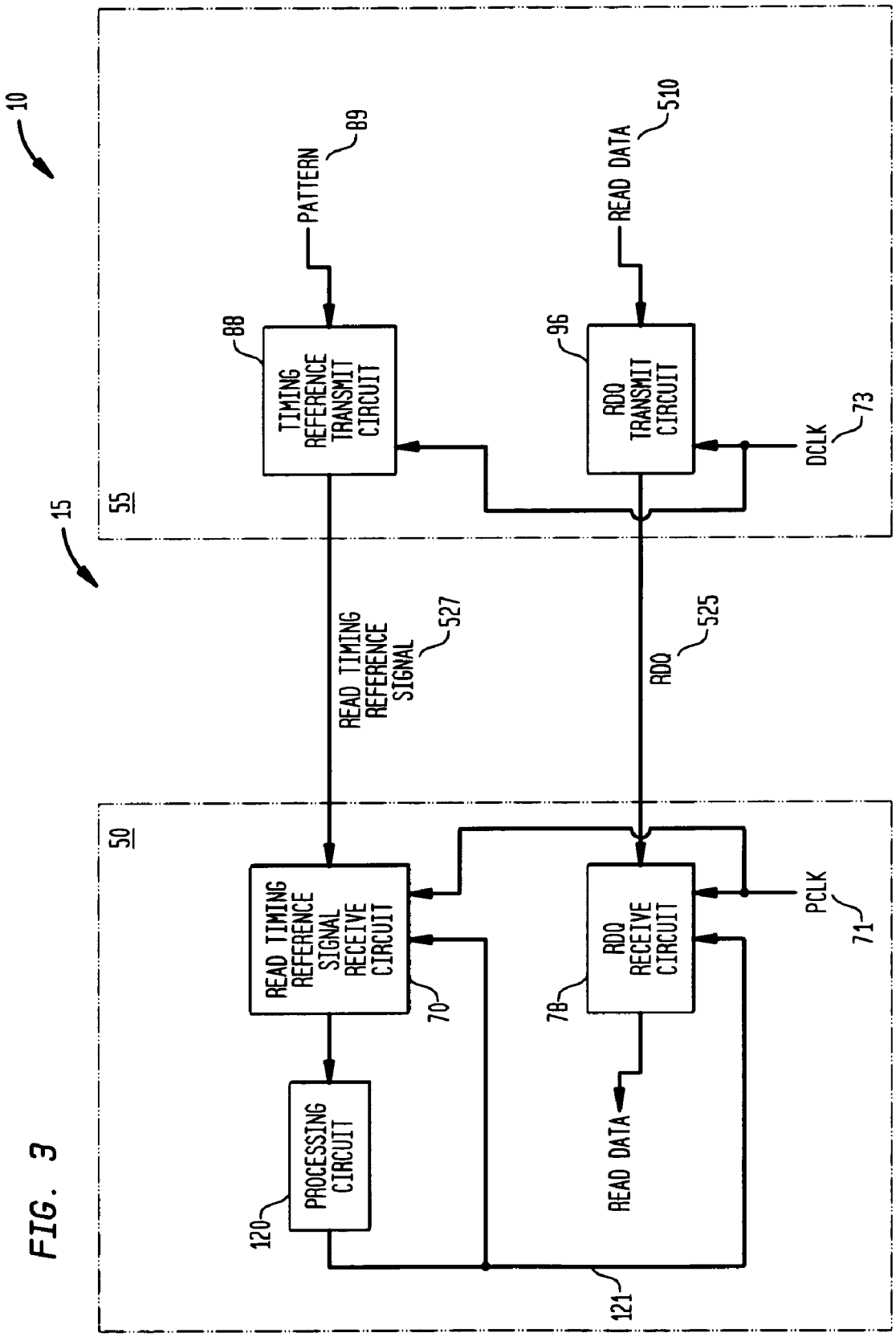
FIG. 3 is a block diagram illustrating a read operation in the memory system in accordance with an embodiment.

FIG. 3 illustrates an example of using a read timing reference signal (RDQS) to calibrate one or more coefficients and/or parameters in a read data (RDQ) receive circuit 78, in accordance with an embodiment. During a read operation, in which data is read from the memory device 55 and transmitted to the controller 50, read data 510 is accessed from the storage cells of the memory device and passed to a RDQ transmit circuit 96. The RDQ transmit circuit is clocked according to DCLK and the output of the circuit is one or more read data signals 525 (RDQ).

A timing reference transmit circuit 88 generates a read timing reference signal (RDQS) 527 based on a pattern 89. The pattern is clocked out of the circuit 88 according to the memory device clock (DCLK) to generate the read timing reference signal. In an embodiment, the pattern generated by the pattern generator is a read data strobe so that the read timing reference signal is a read data strobe signal.

Since both RDQ and the read timing reference signal are clocked out of their respective transmit circuits by DCLK, they are synchronous (i.e., they have a predetermined phase relationship with each other).

The read timing reference signal and read data signal(s) transmitted by the memory device are respectively received at the controller via a read timing reference signal (RDQS) receive circuit 70 and an RDQ receive circuit 78. At the RDQ receive circuit, the read data signal(s) is sampled according to at least one read data clock, which may be derived from PCLK by one or more clock adjusting circuits in the RDQ receive circuit 78 or in the RDQS receive circuit 70. Multiple clock adjustment circuits may be used to generate multiple read data receive clocks to control the timing of sampling multiple RDQ signals that may be output from the RDQ transmit circuit 96. The multiple read data receive clocks may have fixed phase offsets from each other to account for different amount of skews the multiple RDQ signals may experience traveling across the channel 15. The samples generated by the RDQ receive circuit 78 are stored in the controller or forwarded by the controller as read data. At the RDQS receive circuit 70, the RDQS signal is sampled according to a read data receive clock and samples of the RDQS signal are passed to a processing circuit 120.

In order to insure that the read data signal(s) is correctly sampled, the read data signal(s) arriving at the controller 50 should have a proper phase relationship with the corresponding read data receive clock(s). The system 10 provides for calibration of the phase and/or duty cycle of the read data receive clock(s) using the read timing reference signal.

In one embodiment, the system of FIG. 3 samples the read timing reference signal, analyzes the results of such sampling, and adjusts one or more coefficients or parameters associated with the RDQ receive circuit 78 and/or the RDQS receive circuit 70 in view of the analysis. More particularly, the read timing reference signal is sampled by PCLK at receive circuit 70. The receive circuit 70 may sample the read timing reference signal according to both an in-phase clock signal ("data clock signal") and a 90-degree-delayed clock signal ("edge clock signal") to produce respective sets of samples, I-samples and Q-samples. The I-samples and Q-samples generated by the receive circuit are passed to processing circuit 120. The processing circuit considers the timing reference signal samples in pairs, each pair including an I-sample and its corresponding Q-sample. In one embodiment, the processing circuit performs an exclusive-or operation on each pair of I/Q samples to generate a digital sequence (a sequence made up of logical "1s" and/or "0s") associated with the samples. In this regard, processing circuit 120 may be similar to processing circuit 130 of FIG. 2 and may share some circuit components with processing circuit 130.

Further, like processing circuit 130, processing circuit 120 searches for the occurrence of one or more predetermined patterns within the digital sequence to detect one or more error characteristics associated with sampling the read data signal(s), as discussed below in examples with reference to FIGS. 5A-5F. Upon identification of a particular error characteristic, processing circuit 120 generates a correction signal 121 to the RDQ receive circuit 78 and/or the RDQS receive circuit 70 to correct or minimize the associated error.

In the FIG. 3 embodiment, in the situation where the processing circuit 120 detects an error associated with improper timing of the read data receive clock(s), such error can be corrected by the processing circuit 120 sending the correction signal 121 to instruct the RDQ receive circuit 78 to apply proper adjustment to the read data receive clock(s) by, for example, incrementing or decrementing a phase of the read data receive clock(s). The read strobe samples can be analyzed each time data is read from the memory device. So, the timing of sampling the read data can be periodically adjusted to correct for any timing errors that may be caused by, for example, environmental factors.

Figure 4A:
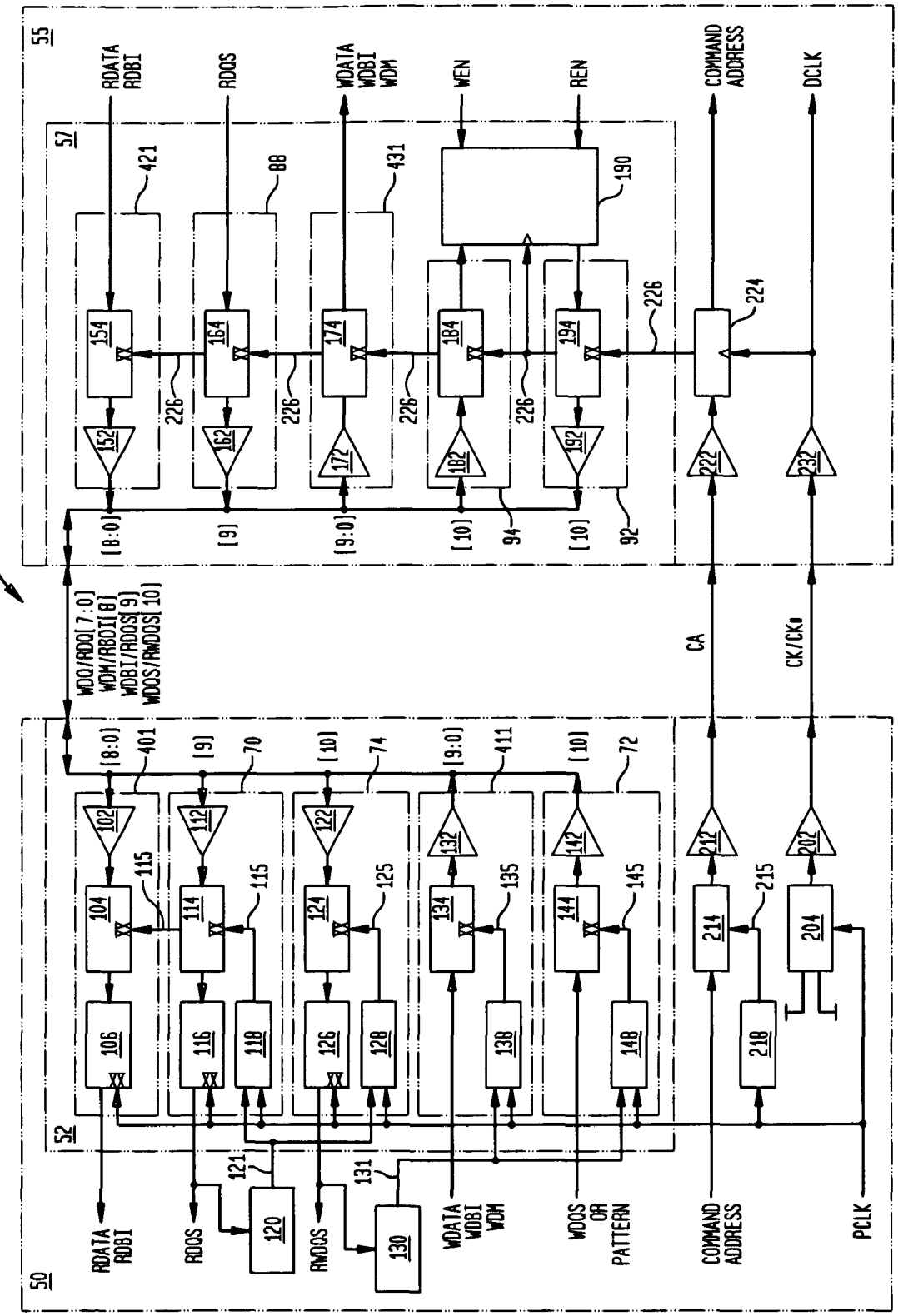
FIGS. 4A and 4B are block diagrams illustrating portions of memory interface circuits in accordance with embodiments.

FIG. 4A shows a portion including a byte slice of an interface circuit 52 in controller 50 and a portion including a byte slice of an interface circuit 57 in memory device 55 according to one embodiment. The byte slices of the interface circuits 52 and 57 shown are for transmitting and receiving in parallel signals conveyed via a portion of channel 15 that is 11 bits wide and capable of conveying 11 signals in parallel, including 8 (bits [0:7]) WDQ or RDQ signals, and correspondingly, 1 (bit [8]) WDM or RDBI signal, 1 (bit [9]) WDBI or RDQS signal, and 1 (bit[10]) WDQS or RWDQS signal.

In one embodiment, controller interface 52 includes a first input circuit 401 having, for example, a set of preamplifiers 102 and a corresponding set of input samplers 104 (although only one of each is shown for ease of illustration). The first input circuit 401 may include a receive circuit 78 for receiving the RDQ signals and/or a receive circuit 66 for receiving the RDBI signal. Interface further includes a second input circuit 70 having, for example, one or more preamplifiers 112 and one or more input samplers 114, for receiving the RDQS signal. The data samples output from the first and second input circuits may be retimed via corresponding retiming circuits 106 and 116, which are driven by PCLK. The first and second input circuits 401 and 70 are driven by a first clock signal 115, which may be derived from PCLK via a clock adjusting circuit 118, which may include, for example, a phase mixer (not shown) to adjust the phase of clock signal 115. The first clock signal may be a read data receive clock.

Controller interface 52 further includes a third input circuit 74 having, for example, one or more preamplifiers 122 and one or more input samplers 124, for receiving the RWDQS signal. The second input circuit may thus include a RWDQS receive circuit 74. The data samples output from the third input circuit may be retimed via one or more retiming circuits 126, which are driven by PCLK. The third input circuit is driven by a second clock signal 125, which is derived from PCLK via a clock adjusting circuit 128, which may include, for example, a phase mixer to adjust the phase of clock signal 125.

Controller interface 52 further includes a first output circuit 411 having, for example, a set of output drivers 132 and a set of output multiplexers 134. The first output circuit may include a WDQ transmit circuit 76 for transmitting the WDQ signal, a WDM transmit circuit 64 for transmitting the WDM signal, and/or a WDBI transmit circuit for transmitting the WDBI signal. The first output circuit 411 is driven by a third clock signal 135, which is derived from PCLK via a clock adjusting circuit 138, which may include, for example, a phase mixer to adjust the phase of clock signal 135. The third clock signal may be a write data transmit clock.

Controller interface 52 further includes a second output circuit 72 having, for example, one or more output drivers 142 and one or more output multiplexers 144, for transmitting the WDQS signal. The second output circuit is driven by a fourth clock signal 145, which is derived from PCLK via a clock adjusting circuit 148, which may include, for example, a phase mixer to adjust the phase of clock signal 145.

Correspondingly, memory interface 57 includes a first output circuit 421 having, for example, a set of output drivers 152 and a corresponding set of output multiplexers 154 (although only one of each is shown for ease of illustration). The first output circuit 21 may include a transmit circuit 96 for transmitting the RDQ signal, and/or a transmit circuit 84 for transmitting the RDBI signal. Interface 57 further includes a second output circuit 88 having, for example, one or more output drivers 162 and one or more output multiplexers 164, for transmitting the RDQS signal.

Memory interface 57 further includes a first input circuit 431 having, for example, a set of preamplifiers 172 and a set of input samplers 174 (although only one of each is shown for ease of illustration). The first input circuit 401 may include a receive circuit 98 for receiving the WDQ signal, a receive circuit 86 for receiving the WDM signal, and/or a receive circuit 90 for receiving the WDBI signal.

Memory interface 57 further includes a second input circuit 94 having, for example, one or more preamplifiers 182 and one or more input samplers 184, for receiving the WDQS signal, and a data cache 190 for storing results of sampling the WDQS signal, such as the WDQS data samples output from the second input circuit and/or their derivatives. In one embodiment, data cache 190 responds to control signals, such as a write enable signal WEN and a read enable signal REN. When WEN is asserted, data cache 190 clocks in data at its input and stores them. When REN is asserted, data cache 190 clocks out data stored therein. Alternatively, data cache 190 is not provided, and results derived from sampling the WDQS signal are stored in a set of memory cells (not shown) in a core of memory device 55, and are written into and read out of the memory cells during read and write operations.

Memory interface 57 further includes a third output circuit 92 having, for example, one or more output drivers 192 and one or more output multiplexers 194, for transmitting the RWDQS signal, which is formed using results of sampling the WDQS signal stored in the data cache 190 or in the core of the memory device 55.

In one embodiment, the first, second, and third output circuits, the first and second input circuits, and the data cache are driven by a clock signal DCLK in the memory device 55. DCLK may be derived from PCLK signal received from the controller 50 or from a clock independent of PCLK.

FIG. 4A also shows a third output circuit in controller 50 having, for example, one or more output driver 202 and one or more output multiplexer 204, for transmitting the PCLK signal(s), and a fourth output circuit in controller 50 having, for example, one or more output driver 212 and one or more output multiplexer 214, for transmitting the CA signal(s). The fourth output circuit is driven by a fifth clock signal 215 in the controller 50, which is derived from PCLK via a clock adjusting circuit 218, which may include, for example, a phase mixer to adjust the phase of clock signal 215.

In one embodiment, controller 50 further includes a processing circuit 120, which receives RDQS samples or their derivatives from the second input circuit 70, and which includes logic to determine whether a phase and/or duty cycle of clock signal 115 and/or 125 needs adjustment based on the RDQS samples or their derivatives, as discussed in more detail below, and output a correction signal 121 in response to the determination. The clock adjusting circuits 118 and/or 128 receive the correction signal 121 in addition to the PCLK signal and adjust the phase and/or duty cycle of the respective clocks 115 and/or 125 accordingly. Controller 50 may also include a processing circuit 130, which receives RWDQS samples or their derivatives from the third input circuit 74, and which includes logic to determine whether a phase and/or duty cycle of clock signal 135 and/or 145 need adjustment based on the RDQS samples or their derivatives, as discussed in more detail below, and output a correction signal 131 in response to the determination. The clock adjusting circuits 138 and/or 148 receive the correction signal 131 in addition to the PCLK signal and adjust the phase and/or duty cycle of the respective clocks 135 and/or 145 accordingly.

Figure 4B:
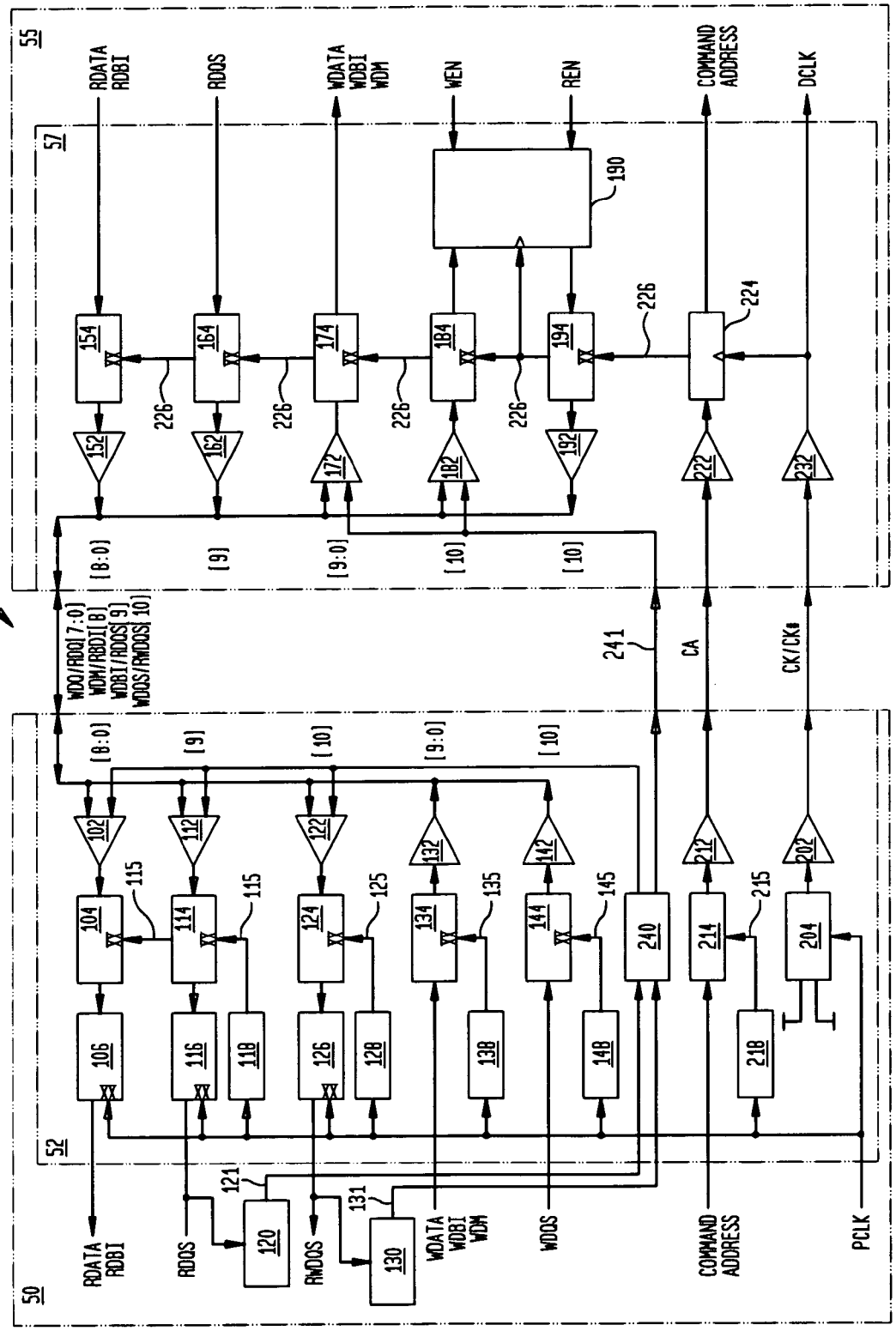

In addition to adjusting the clock signals in controller 50, other coefficients or parameters associated with the input and output circuits in the controller 50 and/or memory 55 may also be adjusted based on output from the processing circuits 120 and/or 130. For example, reference voltage levels used by some or all of the preamplifiers in either or both of controller 50 and memory 55 can be adjusted based on the RWDQS samples and/or RDQS samples and/or their derivatives. FIG. 4B illustrates the memory system 10 having a dynamic reference adjustment circuit 240 in controller 50. Dynamic reference adjustment circuit 240 receives outputs from processing circuits 120 and/or 130 and outputs reference voltage levels (REF) to some or all of the preamplifiers in controller 50 and/or memory 55. A set of one or more dedicated signal lines 241 may be provided for conveying adjusted REF's to memory device 55. Alternatively, the REF's for memory device 55 may be conveyed using shared signal line(s).

As described above, the processing circuits 130 and 120 may be designed to detect timing errors caused by drifting of the phase of the controller clocks and errors caused by drifting of the reference voltages used in receiving signals at the controller 50 and/or the memory device 55. FIGS. 5A-5F are timing diagrams useful for illustrating how errors related to the controller clock phase drift and/or reference voltage drift are detected using the timing reference signals according to such embodiment.

In one embodiment, as discussed above and as shown in FIG. 5A, a timing reference signal 520 is received according to two clock signals 510 and 515, which are phase offset from each other by, for example 90 degrees. The timing reference signal 520 in this example has a simple strobe-like pattern. The timing reference signal 520 is received at the controller 50 if it is a read timing reference signal or at the memory device 55 if it is a write timing reference signal. Clock signal 510 may be an in-phase DCLK signal ("data clock signal"), and clock signal 515 may be a 90-degree-delayed DCLK signal ("edge clock signal"). A reference voltage level 525 is employed in the sampling of the timing reference signal 520. FIG. 5A illustrates the effects of a high reference voltage. Also shown in FIG. 5A are two sample sequences 530 and 535. The sample sequences 530 and 535 correspond respectively to the samples of the timing reference signal 520 taken according to the first and second clock signals 510 and 515. The samples may be processed by a processing circuit 120 or 130 including a logic circuit 540. A digital sequence can be generated by the logic circuit 540 for a given timing reference signal by performing, for example, an exclusive-or operation on each pair of I/Q samples of the strobe signal (i.e. by performing a logical exclusive-or on each pair of I/Q samples and then inverting the result).

In the example of FIG. 5A, the sampling of the timing reference signal 520 according to the data clock signal 510 yields I-samples "1010101", and the sampling of the timing reference signal 520 according to the edge clock signal 515 yields Q-samples "0000000". When the I-samples and Q samples are retimed so corresponding samples are aligned with each other and the aligned samples are provided to the logic circuit 520, which performs an exclusive-or operation on each pair of the I-samples and Q-samples, and outputs a sequence (550), which in this example, includes a pattern of "0101" indicating a possibility that the strobe signal reference voltage is too high.

Referring now to FIG. 5B, there is shown a scenario in which the reference voltage 525 is correct, but the timing reference signal 520 is early relative to the sampling clock signals. As a result, the sampling of the timing reference signal 520 yields I-samples "1010101" and Q-samples "1010101". After exclusive-or operation 540 is performed on the samples, a digital sequence of "1111" results, indicating a possibility that the timing reference signal 520 is early relative to the clock signals. That is the sequence "1111" indicates a phase error that has shifted the phase of the timing reference signal 520 toward the left of the timing diagram. A phase error in the timing reference signal 520 may indicate a phase error either in a transmit clock for timing the transmission of the timing reference signal or in a receive clock for receiving the timing reference signal.

Referring now to FIG. 5C, there is shown a scenario in which the timing of the timing reference signal 520 and reference voltage 525 are correct but the duty cycle of the timing reference signal 520 is too high. As can be seen from FIG. 5O, the resulting digital sequence is "1010". A duty cycle error in the timing reference signal 520 may indicate a duty cycle error in a transmit clock for timing the transmission of the timing reference, when the timing reference signal 520 is clocked out on both the rising and falling edges of the transmit clock.

Figure 5D:
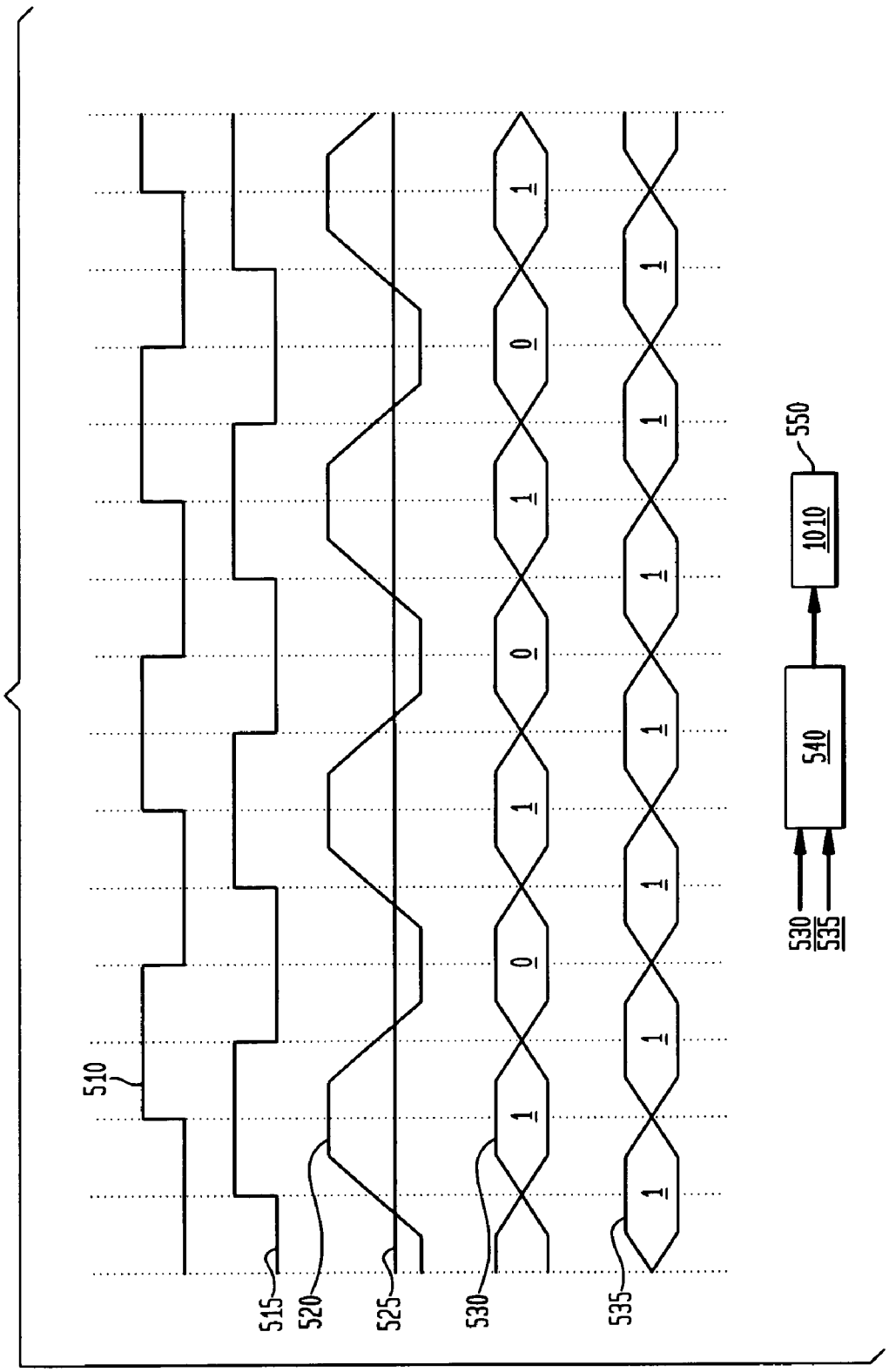

Sometimes, another timing reference signal 520 of a different pattern needs to be used to identify with more certainty the cause of an error. For example, as shown in FIG. 5D, the timing and duty cycle of the timing reference signal 520 are correct but the reference voltage 525 is too low. In such case the resulting digital sequence is "1010", the same as the sequence in the FIG. 5C scenario. Thus, in the illustrative embodiments of FIGS. 5A-5D the digital sequence "1010" may be indicative of two possible errors, a duty cycle error and a reference voltage error.

To resolve the ambiguity, another timing reference signal 520 with a different pattern, such as the pattern of "11001100" shown in FIG. 5E is transmitted and received, and the resulting digital sequence is observed. The pattern 1100100 is immune to the duty cycle error of the transmit clocks but not to the errors in reference voltages. FIG. 5E shows the scenario in which the reference voltage is too low when receiving the timing reference signal 520 with the pattern of "11001100", resulting in a digital sequence including a pattern of "1110". Thus, by transmitting and receiving one or more timing reference signals having different patterns, a cause of an error can be identified with more certainty. For example, as described above, when a first sequence 550 associated with a first timing reference signal 520 includes a pattern of "1010," it indicated a possibility of either a duty cycle error or a reference voltage error. To further identify the cause of the error, a second sequence 550 of a second timing reference signal 520 with the pattern "11001100" is observed. If the second sequence 550 includes a pattern of "1110", it is determined that the duty cycle may be proper but the reference voltage is likely to be too low. If confusion still exists, more timing reference signals 520 with different and possibly more complicated patterns may be used to further identify the cause of the error. Also the phases of the first and second clock signals 510 and 515 may be adjusted and the resulting sequence 550 observed to further identify the cause of the error.

It should be noted that the embodiments discussed in connection with FIGS. 5A-5E are merely illustrative. Upon review of this disclosure one skilled in the art will readily appreciate the many embodiments in which the principles of FIGS. 5A-5F may be applied. For example, the principles discussed in connection with FIGS. 5A-5E may be applied to correct for inter-symbol interference (ISI) and/or cross-talk on the data lines. Still further, the timing reference signal patterns are not limited to those depicted in FIGS. 5A-5E.

Figure 6:
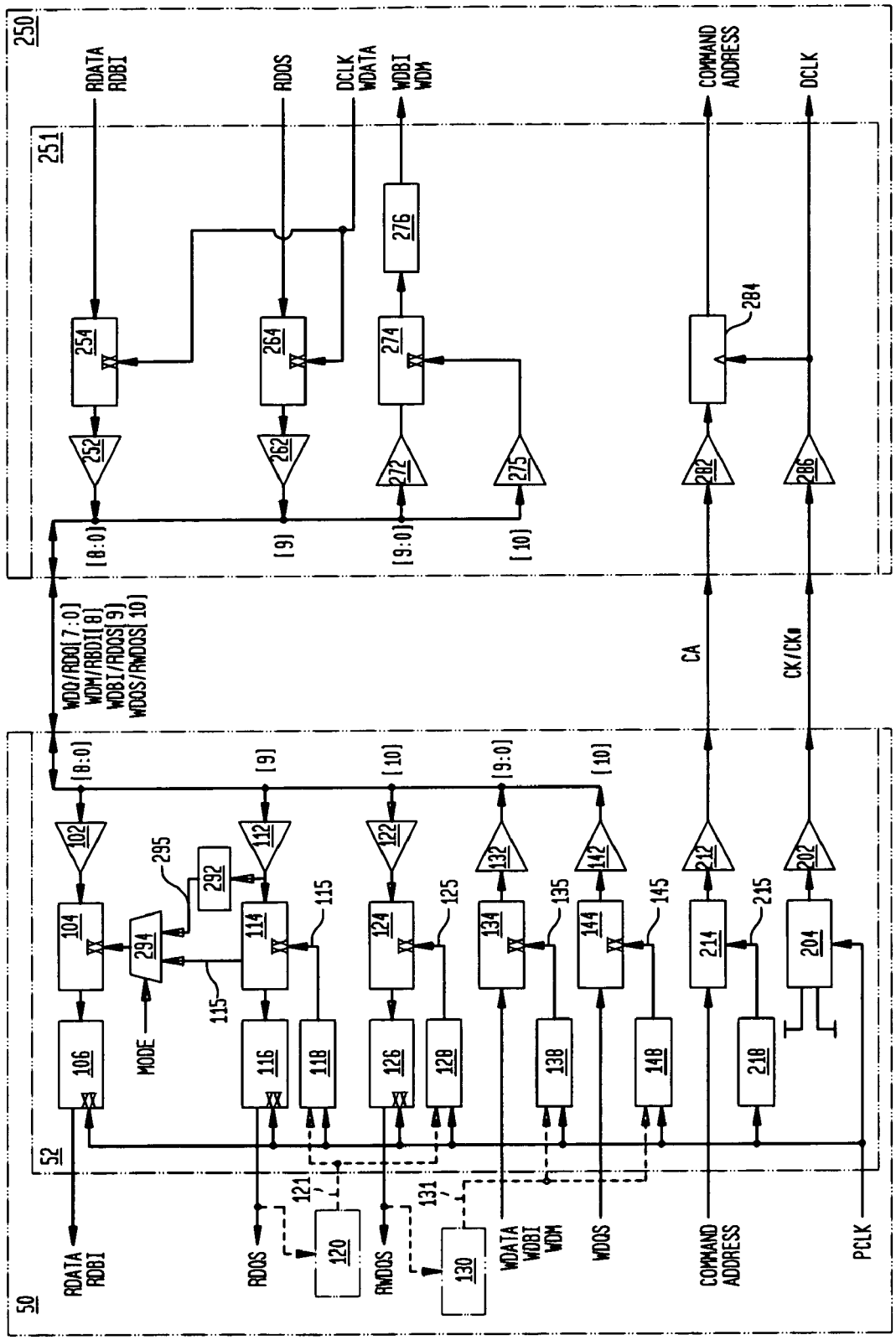
FIG. 6 is a block diagram illustrating a portion of memory interface circuit in accordance with an embodiment.

In one embodiment, controller 50 can be made to operate either with memory device 55 or a conventional memory device 250 using strobe-based timing architecture, as shown in FIG. 6. A byte slice of a memory interface 251 in memory 250 is shown in FIG. 6 to include a first output circuit having, for example, a set of output drivers 252 and a corresponding set of output multiplexers 254, for transmitting the RDQ signal and the RDBI signal, and a second output circuit having, for example, one or more output drivers 262 and one or more output multiplexers 264, for transmitting one or more read strobe RDQS signals.

Memory interface 251 further includes a first input circuit having, for example, a set of preamplifiers 272 and a set of input samplers 274, for receiving the WDQ signal, the WDM signal and the WDBI signal.

Memory interface 251 further includes a second input circuit having, for example, one or more preamplifiers 275 for receiving one or more write strobe WDQS signals.

In one embodiment, the first and second output circuits in the memory device 55 are driven by a memory device clock DCLK, and the first input circuit in memory device 250 is driven by the received write strobe signal WDQS.

Correspondingly, when operating with memory 250, controller 50 also samples incoming read data RDQ using the read strobe signal RDQS. Thus, controller 50 further includes a delay circuit 292 that receives output from preamplifier 112, which receives the RDQS, and that adds appropriate predetermined delays to the RDQS signal to account for any mismatching of the RDQ and RDQS signal paths. Controller 50 further includes a select circuit 294, such as a multiplexer, which responds to a mode select signal (MODE) to select either the received RDQS signal 295 output from the delay circuit 292 or the clock signal 115 to clock the sampling circuit 104, which samples the RDQ signal. Thus, based on the setting of the MODE signal, controller 50 can be configured to work with either memory device 55 or memory device 250.

In view of the single memory controller/single memory device embodiments described herein, one skilled in the art will readily appreciate how the invention may be implemented in systems having one memory controller and multiple memory devices. Nevertheless, it is noted that in one type of multiple memory device embodiment, the memory controller provides a distinct timing reference signal for each memory device, with each such timing reference signal being conveyed via a respective timing reference signal line, or by respective timing reference signal lines. As such, calibration of transmit or receive coefficients or parameters using the timing reference signals in multiple memory device systems can be achieved by performing the above operations with respect to each memory device.

In the embodiments discussed above, the tasks of analyzing the samples of the timing reference signals and adjusting transmit or receive parameters or coefficients are handled in the controller. Thus, the components required in the memory device can be simple and economical. For example, in the embodiment discussed above with reference to FIG. 2, the samples of the write timing reference signal taken in the memory device are stored and sent back to the controller without any further processing. However, it is possible to perform minimal processing such as, for example, the exclusive-or processing of pairs of samples, at the memory device, so that the results of such minimal processing, rather than the samples themselves, are stored and sent back to the controller. However, any processing at the memory device desirably is minimal to minimize circuit complexity at the memory device. In practice, either a "first-order" or a "second order" representation of a set of samples may be formed in the memory device. The first-order representation includes the samples themselves and/or the results of applying no more than one logical process to samples or groups of samples in the set as, for example, the results of the exclusive-or operation. A "second-order" representation of a set of samples includes the results of applying one or more than one logical processes to samples or groups of samples in the set. For example, a "second-order" representation may be the results of the pattern detection operation that is performed on the results of the exclusive-or operation.

Also, the embodiments discussed above have used a memory architecture similar to that of a DRAM merely as an example of the memory. The techniques discussed above can be applied with other forms of memory.

As these and other variations and combinations of the features discussed above can be utilized without departing from the present invention as defined by the claims, the foregoing description of the one embodiments should be taken by way of illustration rather than by way of limitation of the invention as defined by the claims.

The invention claimed is:

1. A method of operation in a memory device, the method comprising:
    receiving, from a memory controller, a data signal via a data signal line, a strobe signal via a strobe signal line and a timing signal via a timing signal line;
    sampling the data signal synchronously with respect to the timing signal to generate data samples representative of data conveyed in the data signal;
    sampling the strobe signal synchronously with respect to the timing signal to generate timing information indicative of a timing relationship between the timing signal and the data signal; and
    outputting the timing information to the memory controller via the strobe signal line.

2. The method as recited in claim 1, wherein sampling the strobe signal synchronously with respect to the timing signal comprises sampling the strobe signal in response to the transitions of the timing signal.

3. The method as recited in claim 1, wherein sampling the strobe signal synchronously with respect the timing signal comprises sampling the strobe signal in response to transitions of a first signal having a first phase offset relative to the timing signal and sampling the strobe signal in response to transitions of a second signal having a predetermined phase offset relative to the first signal.

4. The method as recited in claim 3, wherein the predetermined phase offset corresponds to half a nominal time interval between successive transitions of the strobe signal.

5. The method as recited in claim 3, wherein the timing signal is a clock signal, and wherein the first signal is a first delayed version of the clock signal and the second signal is a second delayed version of the clock signal.

6. The method as recited in claim 5, wherein the predetermined phase offset corresponds to one-fourth of the period of the clock signal.

7. The method as recited in claim 1, further comprising receiving a control signal via a control-address line and sampling the control signal synchronously with respect to the timing signal.

8. The method as recited in claim 1, further comprising storing the timing information within the memory device.

9. The method as recited in claim 8, wherein storing the timing information within the memory device comprises storing the timing information in a data cache.

10. The method as recited in claim 8, wherein storing the timing information within the memory device comprises storing the timing information in a memory core of the memory device.

11. The method as recited in claim 1, wherein, at least during periods of data transmission via the data signaling line, the strobe signal oscillates at a lower frequency than the timing signal.

12. A method of operation in a memory controller, comprising:
    transmitting a data signal to a memory device via a data signal line synchronously with respect to a first clock signal;
    transmitting a timing signal to the first memory device via timing signal line synchronously with respect to the first clock signal, the timing signal to enable the memory device to sample the data signal at desired sampling instants relative to transitions of the data signal;
    transmitting a strobe signal to the memory device via a strobe signal line synchronously with respect to the first clock signal;
    receiving, via the strobe signal line, timing information from the memory device that indicates a timing relationship, at the memory device, between the timing signal and the strobe signal; and
    adjusting a phase offset between the timing signal and the strobe signal in response to the timing information.

13. The method as recited in claim 12, wherein the strobe signal line and data signal line yield similar signal propagation delays such that transitions of the strobe signal are nominally aligned, at the memory device, with the desired sampling instants of the data signal, and wherein adjusting a phase offset between the timing signal and the strobe signal comprises reducing an undesired timing offset between actual data sampling instants triggered by the timing signal and the desired sampling instants.

14. The method as recited in claim 12 wherein transmitting a timing signal via a timing signal line comprises transmitting a clock signal via the timing signal line.

15. The method as recited in claim 14, further comprising transmitting a control signal to the memory device via a control-address line synchronously with respect to the timing signal.

16. The method as recited in claim 12 wherein, at least during periods of data transmission over the data signaling line, the strobe signal oscillates at a lower frequency than the timing signal.

17. A method of operation in a memory controller, the method comprising:
    receiving a data signal representing read data in parallel with at least one timing reference signal;
    sampling the data signal according to a first clock signal;
    sampling the at least one timing reference signal; and analyzing results of sampling the at least one timing reference signal to determine whether the first clock signal needs to be adjusted.

18. The method as recited in claim 17, further comprising adjusting a phase the first clock signal in response to having determined that the first clock signal needs to be adjusted.

19. The method as recited in claim 17, wherein sampling the at least one timing reference signal includes sampling the at least one timing reference signal according to a second clock signal having a predetermined phase offset from the first clock signal.

20. The method as recited in claim 17, wherein the at least one timing reference signal includes a strobe signal.

21. The method as recited in claim 17, wherein the at least one timing reference signal includes a signal having a predetermined pattern.

22. A method of operation in a memory system including a memory controller and a memory device, comprising:
   transmitting a first timing reference signal from the memory controller to the memory device in parallel with a data signal;
   sampling the first timing reference signal at the memory device;
   transmitting results derived from sampling the first timing reference from the memory device to the memory controller; and
   adjusting a controller clock at the memory controller based on the results of sampling the first timing reference signal.

23. The method as recited in claim 22, further comprising:
   transmitting a second timing reference signal according from the memory device to the memory controller;
   sampling the second timing reference signal; and
   adjusting a controller clock based on results of sampling the second timing reference signal.

24. The method of claim 23, wherein the first timing reference signal includes a write strobe signal.

25. The method of claim 23 wherein the second timing reference signal includes a read strobe signal.

26. The method of claim 23, wherein the first timing reference signal includes a signal with a predetermined pattern.

27. The method of claim 23, wherein the second timing reference signal includes a signal with a predetermined pattern.

28. A memory system, comprising:
   a memory controller to transmit a write data signal in parallel with a first timing reference signal during a memory write operation; and
   a memory device to receive the write data signal and first timing reference signal, to sample the received write data signal and first timing reference signal, and to transmit results derived from sampling the first timing reference signal to the memory controller;
   the memory controller receiving and analyzing the results of sampling the first timing reference signal and adjusting a first memory controller clock in response to having determined that such adjustment is needed.

29. The memory system as recited in claim 28, wherein the memory device is further configured to transmit a read data signal and a second timing reference signal during a memory read operation, and the memory controller is to receive the read data signal and the second timing reference signal, to sample the received read data signal and second timing reference signal, and to adjust a second memory controller clock based on results derived from sampling the second timing reference signal.

30. The memory system as recited in claim 28, wherein the first timing reference signal includes a write strobe signal.

31. The memory system as recited in claim 28, wherein the second timing reference signal includes a read strobe signal.

32. The memory system as recited in claim 28, wherein the first timing reference signal includes a signal having a predetermined pattern.

33. The memory system as recited in claim 28, wherein the second timing reference signal includes a signal having a predetermined pattern.

34. A memory controller, comprising:
   output circuits to output a write data signal via a data signaling line and a first timing reference signal via a timing reference signal line according to one or more first memory controller clocks; and
   a first input circuit to receive, via the timing reference signal line, information derived from samples of the first timing reference signal; and
   first processing circuitry to analyze the received information to determine whether one or more first memory controller clocks need to be adjusted.

35. The controller as recited in claim 34, wherein the first timing reference signal is a write strobe signal.

36. The controller as recited in claim 34, wherein the first timing reference signal is a signal having a predetermined pattern.

37. The controller as recited in claim 34, further comprising:
   a second input circuit to receive a read data signal and a second timing reference signal according to one or more second memory controller clocks;
   sampling circuitry to sample the read data signal and the second timing reference signal; and
   second processing circuitry to analyze results of sampling the second timing reference signal, and to determine whether the one or more second memory controller clocks need to be adjusted.

38. The controller as recited in claim 37, wherein the second timing signal is a read strobe signal.

39. The controller as recited in claim 37, wherein the second timing signal is a signal having a predetermined pattern.

40. An information-bearing medium having computer-readable information thereon, the computer-readable information being configured to actuate a circuit-forming apparatus to form the memory controller as recited in claim 34.

41. A memory device, comprising:
   input circuits to receive a, data signal representing write data via a data signal line and a timing reference signal via a timing reference signal line;
   sampling circuitry to sample the data signals and the at least one timing reference signal; and
   at least one output circuit to transmit, via the timing reference signal line, timing information obtained from sampling the at least one timing reference signal.

42. The memory device as recited in claim 41, wherein the at least one timing reference signal includes a strobe signal.

43. The memory device as recited in claim 41, wherein the at least one timing reference signal includes a signal having a predetermined pattern.

44. The memory device as recited in claim 41, further comprising a cache for storing the timing information obtained from sampling the at least one timing reference signal.

45. The memory device as recited in claim 41, wherein the sampling circuitry includes at least one first sampler to sample the at least one timing reference signal according to a first clock signal and at least one second sampler to sample the at least one timing reference signal according to a second clock signal having a predetermined phase offset from the first clock signal.

46. An information-bearing medium having computer-readable information thereon, the computer-readable information being configured to actuate a circuit-forming apparatus to form the memory device as recited in claim 41.

* * * * *

UNITED STATES PATENT AND TRADEMARK OFFICE
CERTIFICATE OF CORRECTION

PATENT NO.        : 8,159,887 B2
APPLICATION NO.   : 12/596535
DATED             : April 17, 2012
INVENTOR(S)       : Jade M. Kizer et al.

It is certified that error appears in the above-identified patent and that said Letters Patent is hereby corrected as shown below:

In Column 15, Claim 22, line 27 delete "; and" and insert --via at least one signal line that is also used for transmitting the first timing reference signal from the memory controller to the memory device; and--

In Column 15, Claim 28, line 54 delete ";" and insert --via at least one signal line that is also used for transmitting the first timing reference signal from the memory controller to the memory device;--

Signed and Sealed this
Tenth Day of July, 2012

David J. Kappos
*Director of the United States Patent and Trademark Office*